United States Patent
Gong et al.

(10) Patent No.: US 10,085,351 B2
(45) Date of Patent: Sep. 25, 2018

(54) COATING COMPOSITION, COMPOSITE PREPARED BY USING THE COATING COMPOSITION AND METHOD FOR PREPARING THE SAME

(71) Applicant: BYD COMPANY LIMITED, Shenzhen, Guangdong (CN)

(72) Inventors: Qing Gong, Guangdong (CN); Wei Zhou, Guangdong (CN); Xinping Lin, Guangdong (CN); Weifeng Miao, Guangdong (CN); Xiaofang Chen, Guangdong (CN)

(73) Assignee: BYD COMPANY LIMITED, Shenzhen (CN)

( * ) Notice: Subject to any disclaimer, the term of this patent is extended or adjusted under 35 U.S.C. 154(b) by 202 days.

(21) Appl. No.: 14/657,823

(22) Filed: Mar. 13, 2015

(65) Prior Publication Data

US 2015/0189762 A1 Jul. 2, 2015

Related U.S. Application Data

(63) Continuation of application No. PCT/CN2013/085840, filed on Oct. 24, 2013.

(30) Foreign Application Priority Data

Oct. 26, 2012 (CN) .......................... 2012 1 0416065

(51) Int. Cl.
- H05K 3/18 (2006.01)
- C23C 18/16 (2006.01)
- C23C 18/18 (2006.01)
- C23C 18/20 (2006.01)
- H05K 1/03 (2006.01)

(52) U.S. Cl.
CPC ......... *H05K 3/185* (2013.01); *C23C 18/1608* (2013.01); *C23C 18/1612* (2013.01); *C23C 18/1651* (2013.01); *C23C 18/1868* (2013.01); *C23C 18/1882* (2013.01); *C23C 18/204* (2013.01); *C23C 18/2066* (2013.01); *H05K 1/0373* (2013.01); *H05K 3/188* (2013.01); *C23C 18/1653* (2013.01); *Y10T 428/24917* (2015.01)

(58) Field of Classification Search
CPC ...... H05K 3/185; H05K 3/188; H05K 1/0373; Y10T 428/24917
See application file for complete search history.

(56) References Cited

U.S. PATENT DOCUMENTS

| | | | |
|---|---|---|---|
| 5,599,592 A | 2/1997 | Laude | |
| 5,997,713 A * | 12/1999 | Beetz, Jr. | B81B 1/004 205/124 |
| 6,150,456 A * | 11/2000 | Lee | B32B 27/34 428/325 |
| 2003/0031803 A1 | 2/2003 | Belouet et al. | |
| 2007/0087215 A1 | 4/2007 | Sauer | |
| 2008/0004367 A1* | 1/2008 | Takada | B32B 27/32 522/107 |

FOREIGN PATENT DOCUMENTS

| | | |
|---|---|---|
| CN | 1481448 A | 3/2004 |
| CN | 1539028 A | 10/2004 |
| CN | 1701135 A | 11/2005 |
| CN | 101421311 A | 4/2009 |
| CN | 101570854 A | 11/2009 |
| CN | 101654564 A | 2/2010 |
| CN | 101747650 A | 6/2010 |
| CN | 101960374 A | 1/2011 |
| CN | 102417745 A | 4/2012 |
| EP | 1148153 A2 | 10/2001 |
| JP | S4920031 A | 2/1974 |
| JP | 101154317 A | 6/1989 |
| JP | 09255918 A * | 9/1997 |
| JP | H09255918 A | 9/1997 |
| JP | 2000-311527 A | 11/2000 |
| JP | 2001271171 A | 10/2001 |
| JP | 2012524169 A | 10/2012 |
| KR | 20010089839 A | 10/2001 |
| WO | 2005010234 A1 | 2/2005 |
| WO | 2005092813 A2 | 10/2005 |
| WO | WO 2008/096671 A1 | 8/2008 |
| WO | WO 2008/140272 A2 | 11/2008 |
| WO | 2011072506 A1 | 6/2011 |
| WO | 2011085584 A1 | 7/2011 |
| WO | WO 2014/063636 A1 | 5/2014 |

OTHER PUBLICATIONS

PCT International Search Report and Written Opinion dated Feb. 20, 2014, issued in International Application No. PCT/CN2013/085840 (16 pages).

Xin, Hang et al, "Study on the Catalysis of Semiconductor Oxides in Nonmetal Electroless Copper Plating," Electroplating & Pollution Control, vol. 9, No. 1, pp. 19-21, Jan. 1989.

* cited by examiner

*Primary Examiner* — Mark S Kaucher

(57) ABSTRACT

A coating composition, a composite prepared by using the coating composition, and a method for preparing the composite are provided. The coating composition includes a solvent, an adhesive, and a catalyst precursor including at least one chosen from $SnO_2$, $ZnSnO_3$ and $ZnTiO_3$.

14 Claims, No Drawings

US 10,085,351 B2

COATING COMPOSITION, COMPOSITE PREPARED BY USING THE COATING COMPOSITION AND METHOD FOR PREPARING THE SAME

CROSS-REFERENCE TO RELATED APPLICATIONS

This application is a continuation of International Patent Application No. PCT/CN2013/085840, filed Oct. 24, 2013, which claims priority to and the benefits of Chinese Patent Application No. 201210416065.5, filed with the State Intellectual Property Office of P.R. China on Oct. 26, 2012, the entire contents of both of which are incorporated herein by reference.

FIELD

The present disclosure relates to the surface metallization field, and more particularly relates to a coating composition, a method for preparing a composite by using the coating composition, and a composite prepared by the method.

BACKGROUND

Forming a metal layer on a surface of a plastic substrate as a passage for transmitting electromagnetic signal is widely used in the fields of vehicle, industry, computer and communication. Selectively metallizing the surface of the plastic substrate to form a metal layer, i.e. forming the metal layer on a pre-determined region of the surface of the plastic surface, is a key point in the manufacture of those plastic products.

There are many methods for forming a metal circuit by metallizing the surface of the plastic substrate. For example, first a metal core is formed on the surface of the plastic substrate, and thus chemical plating is performed on the surface of the plastic substrate with the metal core being the active site.

However, conventional methods for selectively metallizing the surface of the plastic substrate have some disadvantages, for example, the chemical plating catalysts used in those methods are all color materials (black, gray, brown, yellow, green, etc.), which cannot satisfy the requirements for white products.

SUMMARY

Embodiments of the present disclosure seek to solve at least one of the problems existing in the prior art to at least some extent, or to provide a consumer with a useful commercial choice.

In a first broad aspect of the present disclosure, there is provided a coating composition. The coating composition may comprise: a solvent, an adhesive, and a catalyst precursor including at least one selected from the group consisting of $SnO_2$, $ZnSnO_3$ and $ZnTiO_3$.

According to some embodiments of present disclosure, the catalyst precursor contained in the coating composition may be white. Thus, the coating composition may be used to produce a composite product with at least a part being white and having a metal layer on a predetermined region thereof, which may satisfy the current requirements of making white products. Additionally, the inventors found surprisingly that the catalyst precursor described herein may be transformed into a chemical plating catalyst, and thus chemical plating may be performed with the catalyst.

In a second broad aspect of the present disclosure, there is provided a method for preparing a composite. The method may comprise: providing the coating composition described herein on a surface of an insulating substrate to form a white coating layer; gasifying a predetermined region of the white coating layer to expose the catalyst precursor and transform the catalyst precursor into a catalyst; and forming a metal layer on the predetermined region by chemical plating.

As described above, the catalyst precursor contained in the coating composition may be white, and thus the method may be used to produce a product with at least a part being white and having a metal layer on a predetermined region thereof, which may satisfy the current requirements of making white products. The coating layer formed on the surface of the insulating substrate may be white, and the white coating layer may not influence the inherent properties of the insulating substrate. Additionally, the inventors found surprisingly that when a predetermined region of the white coating layer is grasified, the catalyst precursor may be transformed into a chemical plating catalyst, and thus chemical plating may be performed to produce a metal layer. And according to some embodiments of present disclosure, the chemical plating may be performed on the surface of the white coating layer directly to form a metal layer on the predetermined region. The inventors found surprisingly that the metal layer of the resulting composite may have good adhesion to the insulating substrate.

In a third broad aspect of the present disclosure, there is provided a composite product prepared by the method described herein.

As described herein, the composite product obtained by the method described herein may have a metal layer, at least a part of which may be white, which may satisfy the current requirements of making white products. And the inventors also found that the metal layer of the resulting composite may have good adhesion to the insulating substrate.

Additional aspects and advantages of embodiments of present disclosure will be given in part in the following descriptions, become apparent in part from the following descriptions, or be learned from the practice of the embodiments of the present disclosure.

DETAILED DESCRIPTION

Reference will be made in detail to embodiments of the present disclosure. The embodiments described herein are explanatory, illustrative, and used to generally understand the present disclosure. The embodiments shall not be construed to limit the present disclosure.

According to some embodiments of the present disclosure, a coating composition is provided. The coating composition may comprise: a solvent, an adhesive, and a catalyst precursor including at least one selected from the group consisting of $SnO_2$, $ZnSnO_3$ and $ZnTiO_3$.

According to some embodiments of present disclosure, the catalyst precursor contained in the coating composition may be white. Thus, the coating composite may be used to produce a product with at least a part being white and having a metal layer on a predetermined region thereof, which may satisfy the current requirements of making white products. Additionally, the inventors found surprisingly that the catalyst precursor may be transformed into a chemical plating catalyst, and thus chemical plating may be performed with the catalyst. According to some embodiments of present disclosure, the catalyst precursor in a predetermined region of a white coating layer formed by the coating composition may be transformed into a catalyst for chemical plating when the predetermined region of the white coating layer is gasified, so that the chemical plating can be performed on the surface of the white coating layer directly to form a metal layer on the predetermined region of the surface of the white coating layer. And the metal layer of the resulting product may have good adhesion to the insulating substrate.

The inventors found that the catalyst precursor described herein is a covalent metal compound, which has a high catalytic activity after being activated with low energy. For example, after being irradiated by a laser, the catalyst precursor may be easily transformed into a compound having crystal defects, for example, oxygen vacancies. The compound having crystal defects may be used as a chemical plating catalyst (also referred as catalyst hereinafter), and thus chemical plating may be performed on the surface of the coating layer directly. Additionally, all of $SnO_2$, $ZnSnO_3$ and $ZnTiO_3$ are commercially available, which will reduce the production costs of the coating composition and the composite product.

In some embodiments of the present disclosure, the catalyst precursor may have an average particle diameter ranging from about 1 nanometer to about 1 micron. In some embodiments, the catalyst precursor may have an average particle diameter ranging from about 1 nanometer to about 500 nanometers. In some further embodiments, the catalyst precursor may have an average particle diameter ranging from about 1 nanometer to about 100 nanometers. Accordingly, the efficiency of the coating composition in the preparation of a composite product may be further increased. In some embodiments, the average particle diameter of the catalyst precursor may be measured by using a crystalline laser, with ethanol as a dispersion medium.

The inventors found that $SnO_2$, $ZnSnO_3$ and $ZnTiO_3$ may have good compatibility with commonly used adhesives. In some embodiments, the coating composition may further comprise adhesives, which may directly influence the properties of the coating composition, such as glossiness, aridity, and mechanical strength. In some embodiments, the adhesive may include an air-curing acrylic resin, such as, e.g., HR-7004, HR-7008, HR-7000, or HR-7100 commercially available from Mitsubishi rayon polymer Nantong Co., LTD. In other embodiments, the adhesive may include an UV-curing acrylic resin, such as, e.g., Desmolux® U100, Desmolux® VP LS 2396, Desmolux® VP LS 2266, or Desmolux® XP 2513 commercially available from BAYER AG. In yet other embodiments, the adhesive may include a heat-curing polyurethane, such as, e.g., Bayhydrol® PT355 or Bayhydrol® XP2557 commercially available from BAYER AG. In still other embodiments, the adhesive may include a water-curing polyurethane, such as, e.g., Desmodur® IL 1451, Desmodur® N 100, Desmodur® N 3390 BA/SN, or Desmodur® E 15 produced by BAYER.

In some embodiments, the solvent may include water. In some embodiments, the solvent may also include organic solvents commonly used in the art, for example, benzenes, trichloroethylene, alcohols, ketones, diketones, cyclic ketones, and combinations thereof. In some embodiments, the benzenes may include benzene, toluene, or xylene. In some embodiments, the alcohols may have a general formula of $C_nH_{2n+2}O$, in which n is an integer and n≥1. In some embodiments, n may be 1, 2, 3, or 4. For example, in some embodiments, the alcohols may include methanol, ethanol, propanol, butanol, amyl alcohol, hexyl alcohol, heptanol, or octanol. In some embodiments, the ketones may have a general formula of $C_mH_{2m}O$, in which m is an integer and m≥3. For example, in some embodiments, the ketones may include acetone, pentanone, or methyl ethyl ketone. In some embodiments, the diketones may have a general formula of $C_aH_{2a-2}O_2$, in which a is an integer and a≥4. In some embodiments, the cyclic ketones may have a general formula of $C_bH_{2b-2}O$, and b=5, 6, 7 or 8. In some embodiments, the cyclic ketone may include cyclohexanone.

In some embodiments of the present disclosure, the coating composition may further comprise an additive. In some embodiments, the additive may include at least one selected from the group consisting of dispersing agent, antifoaming agent, leveling agent, and viscosity regulator.

In some embodiments, the dispersing agent may include ANTI-TERRA®-U, DISPERBYK®-101, BYK®-220 S, LACTIMON®-WS, BYK®-W 966, BYK®-154, DISPERBYK®-110, DISPERBYK®-140, DISPERBYK®-2150, or DISPERBYK®-2025 commercially available from BYK (Germany). In some embodiments, the dispersing agent may include PHOSPHOLAN® PS-236 commercially available from Akzo nobel or PS-21A commercially available from Witco. In some embodiments, the dispersing agent may include fish oils, glycerol trioleate, tri-n-octylphosphine oxide, tri-n-octylphosphine, pyrimidines, fatty amines, alcamines, or Hypermer® KD serial or Zephrym® PD serial commercially available from CRODA (England).

In some embodiments, the antifoaming agent may include BYK®-051, BYK®-052, BYK®-053, BYK®-055, BYK®-057, BYK®-A555, BYK®-071, BYK®-060, BYK®-018, BYK®-044, or BYK®-094.

In some embodiments, the leveling agent may include BYK®-333, BYK®-306, BYK®-358N, BYK®-310, BYK®-354, or BYK®-356.

In some embodiments, the viscosity regulator may include fumed silica, polyamide wax, organic bentonite, hydrogenated castor oil, or metallic soap. In some embodiments, the viscosity regulator may include cellulose derivative, such as, e.g., hydroxyethyl cellulose; or water soluble resin, such as, e.g., polyvinyl alcohol or polyacrylic acid salt.

In some embodiments, the coating composition of present disclosure may be produced by simple mixing the components described herein.

According to some embodiments of present disclosure, the catalyst precursor and the dispersing agent may be added into the solvent to form a first mixture, and the first mixture may be milled in a planetary ball mill for about 6 hours to about 12 hours. Then the adhesive, the antifoaming agent, the leveling agent, or the viscosity regulator may be added into the milled first mixture to form a second mixture, and the second mixture may be milled in the planetary ball mill for about 6 hours to about 12 hours. Thus a uniform and stable coating composition may be obtained.

In some embodiments, based on 100 weight parts of the solvent, the amount of the catalyst precursor may range from about 100 weight parts to about 300 weight parts; the amount of the adhesive may range from about 5 weight parts to about 15 weight parts; the amount of the additive may range from about 0.1 weight parts to about 15 weight parts. In some embodiments, based on 100 weight parts of the solvent, the amount of the dispersing agent may range from about 0.5 weight parts to about 4 weight parts; the amount of the antifoaming agent may range from about 0.3 weight parts to about 3 weight parts, the amount of the leveling agent may range from about 0.1 weight parts to about 4 weight parts, and the amount of the viscosity regulator may range from about 1 weight parts to about 3 weight parts. Accordingly, the efficiency of the coating composition in the preparation of the composite product may be further increased.

In another aspect of the present disclosure, a method for preparing a composite is provided. The method may comprise: providing the coating composition described herein on a surface of an insulating substrate to form a white coating layer; gasifying a predetermined region of the white coating layer to expose the catalyst precursor and transform the catalyst precursor into a catalyst; and forming a metal layer on the predetermined region by chemical plating.

As described herein, the catalyst precursor contained in the coating composition may be white, and thus the method may be used to produce a product with at least a part being white and having a metal layer on a predetermined region thereof, which may satisfy the current requirements of making white products. The coating layer formed on the surface of the insulating substrate may be white, and the white coating layer may not influence inherent properties of the insulating substrate. Additionally, the inventors found surprisingly that when a predetermined region of the white coating layer is grasified, the catalyst precursor may be transformed into a catalyst, and thus chemical plating may be performed to produce a metal layer. And according to some embodiments of present disclosure, the chemical plating may be performed on the surface of the white coating layer directly to form a metal layer on the predetermined region. The inventors found surprisingly that the metal layer of the resulting composite may have good adhesion to the insulating substrate.

According to some embodiments of the present disclosure, the insulating substrate may be any insulating substrate commonly used in the art. For example, the insulating substrate may include thermosetting plastic or thermoplastic plastic. In some embodiments, the thermoplastic plastic may include: at least one chosen from polyolefin, polyester, polyamide, polyarylether, polyester-imide, polycarbonate (PC), polycarbonate/(acrylonitrile-butadiene-styrene) alloy (PC/ABS), polyphenyl ether (PPO), polyphenylene sulfide (PPS), polyimide (PI), polysulfone (PSU), polyether-etherketone (PEEK), polybenzimidazole (PBI), and liquid crystal polymer (LCP). Accordingly, the efficiency of the method may be further increased.

In some embodiments, the polyolefin may include polystyrene (PS), polypropylene (PP), polymethyl methacrylate, or poly(acrylonitrile-butadiene-styrene). Accordingly, the efficiency of the method may be further increased.

In some embodiments, the polyester may include poly(1,4-cyclohexyledimethylene terephthalate) (PCT), poly(diallyl isophthalate) (PDAIP), poly(diallyl terephthalate) (PDAP), polybutylene naphthalate (PBN), polyethylene terephthalate (PET), or polybutylene terephthalate (PBT). Accordingly, the efficiency of the method may be further increased.

In some embodiments, the polyamide may include polyhexamethylene adipamide (PA-66), polyhexamethylene azelamide (PA-69), poly(tetramethylene adipamide) (PA-64), polyhexamethylene dodecanamide (PA-612), polyhexamethylene sebacamide (PA-610), polydecamethylene sebacamide (PA-1010), polyundecanamide (PA-11), polydodecanamide (PA-12), caprylamide (PA-8), poly(9-aminononanoic acid) (PA-9), polycaproamide (PA-6), poly p-phenylene terephthamide (PPTA), poly(meta-xylylene adipamide) (MXD6), poly(hexamethyleneterephthalamide) (PA6T), or poly(nonamethyleneterephthalamide) (PA9T). Accordingly, the efficiency of the method may be further increased.

The liquid crystal polymer (LCP), which is known by those skilled in the art, is a macromolecular material composed of rigid molecular chains, and has both fluidity of liquids and anisotropy of crystals under certain physical conditions.

In some embodiments, the thermosetting plastic may include at least one selected from the group consisting of phenolic resin, urea resin, melamine formaldehyde resin, epoxy resin, alkyd resin, and polyurethane. Accordingly, the efficiency of the method may be further increased.

In some embodiments, the insulating substrate may be made of glass. For example, the insulating substrate may be made of silica glass, high silicate glass, soda-lime glass, lead-silicate glass, aluminosilicate glass, or borosilicate glass. Accordingly, the efficiency of the method may be further increased.

In some embodiments, the insulating substrate may be made of ceramic. For example, the insulating substrate may be made of aluminum oxide ceramic, silicon nitride ceramic, boron nitride ceramic, beryllium oxide ceramic, or aluminium nitride ceramic. Accordingly, the efficiency of the method may be further increased.

In some embodiments, the insulating substrate may be made of cement. For example, the insulating substrate may be made of silicate cement, aluminate cement, sulphate aluminium cement, aluminoferic cement, fluoroaluminate cement, or phosphate cement. Accordingly, the efficiency of the method may be further increased.

In some embodiments, the insulating substrate may be made of wood. For example, the insulating substrate may be made of plywood, fiber board, shaving board, excelsior board, xylolite, or composite board. Accordingly, the efficiency of the method may be further increased.

With the method for preparing the composite according to some embodiments of the present disclosure, a white coating layer may be formed on the surface of the insulting substrate. When the coating composition is provided on the surface of the insulating substrate, because of the existence of the adhesive, the catalyst precursor may be adhered on the surface of the insulating substrate. When cured, a white coating layer may be formed on the surface of the insulating substrate.

Any method that may provide the coating composition on the surface of the insulting substrate may be applied in the present disclosure, for example, screen printing, spraying, laser printing, ink-jet printing, transfer printing, intaglio printing, letterpress printing, or planographic printing, without particular limits.

In some embodiments, the white coating layer may have a thickness ranging from about 1 micron to about 100 microns. The inventors found that this thickness may improve adhesion between the metal layer and the insulting substrate, and the efficiency of the method may be further increased.

According to some embodiments of the present disclosure, the predetermined region of the white coating layer may be gasified (for example, by a laser), and the metal layer (metal pattern) may be formed on the predetermined region by chemical plating. In some embodiments, the adhesive in the predetermined region of the white coating layer may be gasified, and the catalyst precursor (such as, e.g., at least one chosen from $SnO_2$, $ZnSnO_3$, and $ZnTiO_3$) may be exposed and transformed into a compound having crystal defects (i.e. catalyst or chemical plating catalyst in the present disclosure), for example, a compound having oxygen vacancies.

In some embodiments of the present disclosure, the gasifying may be carried out by a laser commonly used in the art, for example, an infrared laser, an ultraviolet laser, or a green laser. In some embodiments, the laser apparatus may be a green laser.

In some embodiments, the laser may have a wavelength ranging from about 157 nm to about 10.6 microns. In some embodiments, the gasifying may be carried out under a condition of a scanning speed ranging from about 500 mm/s to about 8000 mm/s, a step length ranging from about 3 microns to about 9 microns, and a time delay ranging from about 30 microseconds to about 100 microseconds. In some embodiments, the laser may have a frequency ranging from about 30 KHz to about 40 KHz, a power ranging from about 3 W to about 80 W, and a fill spacing ranging from about 10 microns to about 50 microns. Accordingly, the efficiency of the method may be further increased.

In some embodiments, the predetermined region may be the whole surface of the white coating layer, or may be a part of the surface of the white coating layer, which may be determined according to the practical requirements. In some embodiments, the predetermined region may form a required pattern, such as a configuration of a circuit, so that after the metal layer is formed on the predetermined region, the metal layer may form a required circuit.

In some embodiments, the adhesive may be gasified during the gasifying step. In order to prevent the gasified adhesive from falling off and covering the catalyst precursor, in some embodiments, the laser may further comprise an air-extracting device to remove the gasified adhesive.

In some embodiments, the method may further comprise a step of cleaning the surface of the white coating layer, e.g., by ultrasonic cleaning, before chemical plating.

With the method according to some embodiments of the present disclosure, the exposed catalyst precursor on the predetermined region may be transformed to a chemical plating catalyst having lattice defects when gasified by the laser, and thus chemical plating may be performed on the surface of the chemical plating catalyst in the predetermined area. Methods for performing the chemical plating are known to those skilled in the art, for example, by contacting the catalyst with a chemical plating solution.

In some embodiments, a copper layer is formed on the predetermined region. In some embodiments, when gasified by the laser, the catalyst precursor in the predetermined region may be transformed into a chemical plating catalyst having lattice defects, and the chemical plating catalyst on the insulating substrate may be contacted with a chemical copper plating solution, in which the copper ions in the chemical copper plating solution may be reduced to copper and cover the chemical plating catalyst, thus forming a copper layer in the predetermined area. The copper layer may be dense and formed on the predetermined region rapidly.

In some embodiments, the method may further comprise performing at least one chemical plating and/or electroplating on the copper layer. With the additional plating steps, the resulted metal layer may have better decoration value, practicability, and corrosion resistance.

In some other embodiments, after the copper layer is formed on the predetermined region of the white coating layer, additional metal layers may be formed via methods commonly known to a person skilled in the art.

In some embodiments, after the copper layer is formed, the insulating substrate may be contacted with a chemical nickel plating solution, thus forming a nickel layer on the copper layer. Therefore the metal layer on surface of the white coating layer may include the copper layer and the nickel layer formed on the copper layer.

In some embodiments, after the nickel layer is formed on the copper layer, the insulating substrate may be further contacted with a flash gold plating solution, thus forming a gold layer on the nickel layer. Therefore the metal layer on surface of the coating layer may include a copper layer, a gold layer, and a nickel layer between the copper layer and the gold layer.

In some embodiments, the nickel layer may have a thickness ranging from about 0.1 microns to about 50 microns, such as, e.g., about 1 micron to about 10 microns, or about 2 microns to about 3 microns.

In some embodiments, the copper layer may have a thickness ranging from about 0.1 microns to about 100 microns, such as, e.g., about 1 micron to about 50 microns, or about 5 microns to about 30 microns.

In some embodiments, the gold layer may have a thickness ranging from about 0.01 microns to about 10 microns, such as, e.g., about 0.01 microns to about 2 microns, or about 0.1 microns to about 1 micron.

The chemical copper plating solution, the chemical nickel plating solution, electroplating solution, and the flash gold plating solution may be any common plating solution known to a person skilled in the art. For example, the chemical copper plating solution may comprise a copper salt and a reducing agent, and the chemical copper plating solution may have a pH of about 12 to about 13. With the reducing agent, the cooper ion may be reduced to a copper atom. In some embodiments, the reducing agent may include at least one selected form the group consisting of glyoxylic acid, hydrazine, and sodium hypophosphite.

In some embodiments, copper plating solutions known in the art may also be applied in the present disclosure, for example, the chemical copper plating solution disclosed in Surface Technology, December, 2002, volume 31, No. 6, the copper plating solution including $CuSO_4.5H_2O$ of about 0.12 mol/L, $Na_2EDTA.2H_2O$ of about 0.14 mol/L, potassium ferrocyanide of about 10 mg/L, 2,2'-dipyridyl of about 10 mg/L, and HCOCOOH of about 0.10 mol/L, and the copper plating solution having a pH of about 12.5 to about 13. The PH may be regulated by NaOH and $H_2SO_4$.

In addition, in some embodiments, copper electroplating may performed to further increase the thickness of the copper layer.

In some embodiments, a nickel plating solution known in the art may be applied in the present disclosure. For example, the nickel plating solution may include nickel sulfate of about 23 g/l, sodium hypophosphite of about 18 g/l, lactic acid of about 20 g/l, and malic acid of about 15 g/l, and the nickel plating solution may have a pH of about 5.2 and a temperature ranging from about 85° C. to about 90° C. The PH may be regulated by NaOH.

In some embodiments, the chemical copper plating may be performed for about 10 minutes to about 240 minutes, without special limits.

The flash gold plating technique is known to those skilled in the art. In some embodiments, the flash gold plating solution may be BG-24 neutral gold plating liquid commercially from Shenzhen Jingyanchuang chemical company, China.

According to some embodiments of the present disclosure, the catalyst precursor in a remaining region (the region other than the predetermined region in the surface of the white coating layer) of the white coating layer is not gasified by the laser and is disposed evenly in the adhesive and solution, and is not transformed into the catalyst. Thus copper particles may not be plated on the remaining region.

In addition, the surface of the remaining region may be smoother than the predetermined region. Therefore, even if few copper particles may be formed on the remaining region, the few copper particles may be easily removed because of their poor adhesion with the insulating substrate. In this way, the predetermined region of the insulating substrate may be metalized, and a composite having the metal layer formed on the insulating substrate may be formed.

In yet another aspect of the present disclosure, a composite obtained by the method described herein is provided. The composite may have a metal layer formed on a predetermined region of an insulating substrate. The composite product obtained by the method described herein may comprise a metal layer, at least a part of which may be white, which may satisfy the current requirements of making white products. And the inventor also found that the metal layer of the resulting composite may have good adhesion to the insulating substrate.

The metal layer and the insulating substrate may be those described herein.

Examples of the present disclosure will be further described in details below. Raw materials used in Examples and Comparative Examples are all commercially available.

EXAMPLE 1

A composite A1 was prepared by the following steps.

Step (1)

200 weight parts of a $SnO_2$ having an average particle diameter of 50 nanometers and 2.9 weight parts of a dispersing agent (DISPERBYK®-110) were mixed into 100 weight parts of an solvent (ethanol) to form a first mixture, and the first mixture was milled by a planetary ball mill for 8 hours. Then 10 weight parts of an adhesive (HR-7004), 2.3 weight parts of an antifoaming agent (BYK®-053), 3.27 weight parts of a leveling agent (BYK®-306) and 2.95 weight parts of a viscosity regulator (fumed silica) were added in the milled first mixture to form a second mixture. Then the second mixture was milled by the planetary ball mill for 9 hours to form a uniform and stable white coating composition S10.

Step (2)

The white coating composition S10 was sprayed on a surface of a circuit board carrier of an LED lamp to form a white coating layer having a thickness of 17.6 microns on the circuit board carrier.

Step (3)

The white circuit board carrier obtained from step (2) was irradiated by an infrared laser (DPF-M12 commercially available from SHENZHEN TETE LASER TECHNOLOGY CO., LTD.), and a predetermined region of the white coating layer was irradiated so that a part of the white coating layer S10 was gasified. The laser was carried out under a condition of: a wavelength of 1064 nm, a scanning speed of 1000 mm/s, a step length of 9 microns, a time delay of 30 microseconds, a frequency of 40 KHz, a power of 3 W and a fill spacing of 50 microns. Then the white circuit board carrier was cleaned by ultrasonic wave.

Step (4)

The white circuit board carrier obtained from step (3) was immersed in a chemical copper plating solution for 4 hours to form a copper layer having a thickness of 15 microns on the white circuit board carrier. Then the white circuit board carrier was immersed in a chemical nickel plating solution for 10 minutes to form a nickel layer having a thickness of 5 microns on the copper layer. Finally, the white circuit board carrier was immersed in a flash gold plating solution to form a gold layer having a thickness of 0.03 microns on the nickel layer.

The chemical copper plating solution included: 0.12 mol/L of $CuSO_4.5H_2O$, 0.14 mol/L of $Na_2EDTA.2H_2O$, 10 mg/L of potassium ferrocyanide, 10 mg/L of 2,2'-bipyridine and 0.10 mol/L of glyoxylic acid (HCOCOOH), the chemical copper plating solution has a pH (regulated by NaOH and $H_2SO_4$) of 12.5 to 13. The chemical nickel plating solution included: 23 g/l of a nickel sulfate, 18 g/l of sodium hypophosphite, 20 g/l of a lactic acid and 15 g/l of a malic acid, the chemical nickel plating solution a pH (regulated by NaOH) of 5.2. The flash gold plating solution was a neutral gold plating solution (BG-24 commercially available from Shenzhen Jingyanchuang chemical company, China).

EXAMPLE 2

A composite A2 was produced by a method substantially the same as that in Example 1, with the exception that:

In step (1), 275 weight parts of a $ZnTiO_3$ having an average particle diameter of 20 nanometers and 3.4 weight parts of a dispersing agent (DISPERBYK®-2150) were mixed into 100 weight parts of an solvent (methyl ethyl ketone) to form a first mixture, then the first mixture was milled by a planetary ball mill for 12 hours. Then 13 weight parts of an adhesive (Desmolux® XP 2513), 2.65 weight parts of an antifoaming agent (BYK®-018), 3.44 weight parts of a leveling agent (BYK®-356) and 2.3 weight parts of a viscosity regulator (poly amide wax) were added in the milled first mixture to form a second mixture. Then the second mixture was milled by the planetary ball mill for 12 hours to form a uniform and stable white coating composition S20.

In step (2), the white coating composition S20 was printed on a surface of an electronic connector of an engine via intaglio printing to form a white coating layer having a thickness of 29.4 microns on the shell.

In step (3), the shell obtained from step (2) was irradiated by an infrared laser (DPF-M12 commercially available from SHENZHEN TETE LASER TECHNOLOGY CO., LTD.), and a predetermined region of the white coating layer was irradiated so that a part of the white coating layer S20 was gasified. The laser irradiating was carried out under a condition of: a wavelength of 1064 nm, a scanning speed of 1000 mm/s, a step length of 9 microns, a time delay of 30 microseconds, a frequency of 40 KHz, a power of 3W and a fill spacing of 50 microns. Then the surface of the electronic connector was cleaned by ultrasonic wave.

In step (4), firstly, a copper layer having a thickness of 15 microns was formed on the surface of the electronic connector by chemical plating; then a nickel layer having a thickness of 5 microns was formed on the copper layer by chemical plating; finally, a gold layer having a thickness of 0.03 microns was formed on the nickel layer by chemical plating.

EXAMPLE 3

A composite A3 was produced by a method substantially the same as that in Example 1, with the exception that:

In step (1), 110 weight parts of a $ZnSnO_3$ having an average particle diameter of 90 nanometers and 0.7 weight parts of a dispersing agent (DISPERBYK®-140) were mixed into 100 weight parts of an solvent (water) to form a first mixture, and the first mixture was milled in a planetary ball mill for 7 hours. Then 6 weight parts of an adhesive (Bayhydrol® XP2557), 0.45 weight parts of an antifoaming agent (BYK®-051), 0.16 weight parts of a leveling agent (BYK®-333) and 1.64 weight parts of a viscosity regulator (polyving alcohol) were added in the milled first mixture to form a second mixture. Then the second mixture was milled by the planetary ball mill for 8 hours to form a uniform and stable white coating composition S30.

In step (2), the white coating composition S30 was printed on a surface of a base of a ceramic integrated circuit by transfer printing to form a white coating layer having a thickness of 87 microns on the base.

In step (3), the base obtained from step (2) was irradiated by a green laser (EP-25-THG-D commercially available from Han's Laser Technology Co., Ltd.), and a predetermined region of the white coating layer was irradiated so that a part of the white coating layer S30 was gasified. The laser irradiation was carried out under a condition of: a wavelength of 532 nm, a scanning speed of 2000 mm/s, a step length of 9 microns, a time delay of 30 microseconds, a frequency of 40 KHz, a power of 4W and a fill spacing of 50 microns. Then the surface of the base was cleaned by ultrasonic wave.

In step (4), firstly, a copper layer having a thickness of 7 microns was formed on the surface of the base by chemical plating, then a nickel layer having a thickness of 5 microns was formed on the copper layer by chemical plating.

Thus, a white shell of an engine electronic connector sample A3 was produced.

EXAMPLE 4

A composite A4 was produced by a method substantially the same as that in Example 1, with the exception that:

In step (1), 100 weight parts of a $SnO_2$ having an average particle diameter of 20 nanometers, 146 weight parts of a $ZnSnO_3$ having an average particle diameter of 70 nanometers and 3.15 weight parts of a dispersing agent (BYK®-W 966) were mixed into 100 weight parts of an solvent (toluene) to form a first mixture, and the first mixture was milled by a planetary ball mill for 11 hours. Then 11.5 weight parts of an adhesive (Desmolux® U100), 2.44 weight parts of an antifoaming agent (BYK®-071), 2.67 weight parts of a leveling agent (BYK®-358N) and 2.05 weight parts of a viscosity regulator (fumed silica) were added in the milled first mixture to form a second mixture. Then the second mixture was milled by the planetary ball mill for 10 hours to form a uniform and stable white coating composition S40.

In step (2), the white coating composition S40 was printed on a surface of a silica glass substrate via planographic printing to form a white coating layer having a thickness of 65 microns on the silica glass substrate.

In step (3), the silica glass substrate obtained from step (2) was irradiated by a green laser (EP-25-THG-D commercially available from Han's Laser Technology Co., Ltd.), and a predetermined region of the white coating layer was irradiated so that a part of the white coating layer S40 was gasified. The laser irradiation was carried out under a condition of: a wavelength of 532 nm, a scanning speed of 2000 mm/s, a step length of 9 microns, a time delay of 30 microseconds, a frequency of 40 KHz, a power of 4 W and a fill spacing of 50 microns. Then the surface of the silica glass substrate was cleaned by ultrasonic wave.

In step (4), firstly, copper layer having a thickness of 12 microns was formed on the silica glass substrate by chemical plating, then a nickel layer having a thickness of 5 microns was formed on the copper player by chemical plating, finally a gold layer having a thickness of 0.03 microns was formed on the nickel layer by flash plating.

EXAMPLE 5

A composite A5 was produced by a method substantially the same as that in Example 1, with the exception that:

In step (1), 30 weight parts of a $SnO_2$ having an average particle diameter of 20 nanometers, 55 weight parts of a $ZnSnO_3$ having an average particle diameter of 60 nanometers, 70 weight parts of a $ZnTiO_3$ having an average particle diameter of 60 nanometers and 1.96 weight parts of a dispersing agent (BYK®-154) were mixed into 100 weight parts of an solvent (methanol) to form a first mixture, and the first mixture was milled by a planetary ball mill for 11 hours. Then 9.7 weight parts of an adhesive (HR-7100), 1.93 weight parts of an antifoaming agent (BYK®-057), 2.98 weight parts of a leveling agent (BYK®-354) and 2.34 weight parts of a viscosity regulator (hydroxyethyl cellulose) were added in the milled first mixture to form a second mixture. Then the second mixture was milled by the planetary ball mill for 9 hours to obtain a uniform and stable white coating composition S50.

In step (2), the white coating composition S50 was printed on a surface of a shell of an electronic connector by transfer printing to form a white coating layer having a thickness of 37 microns on the electronic connector.

In step (3), the above electronic connector was irradiated by an infrared laser (DPF-M12 commercially available from SHENZHEN TETE LASER TECHNOLOGY CO., LTD.), and a predetermined region of the white coating layer was irradiated so that a part of the white coating layer S50 was gasified. The laser irradiation was carried out under a condition of: a wavelength of 1064 nm, a scanning speed of 1000 mm/s, a step length of 9 microns, a time delay of 30 microseconds, a frequency of 40 KHz, a power of 3 W and a fill spacing of 50 microns. Then the surface of electronic connector shell was cleaned by ultrasonic wave.

In step (4), firstly, a copper layer having a thickness of 15 microns was formed on the electronic connector shell, then a nickel layer having a thickness of 5 microns was formed on the copper layer, finally a gold layer having a thickness of 0.03 microns was formed on the nickel layer.

Performance Test

The composites A1-A5 were tested according to GB9286-88, and adhesion grade of the metal layers of each composite was measured. The tested results (adhesion grade) were shown in Table 1. The grade 0 has a best adhesive force, and the grade which was greater than 2 was considered as not meeting the requirements.

Grade 0: cut edge is completely smooth, and no layer falls off;

Grade 1: few flakes on a cut intersection are removed, but no more than 5% of the grid region is affected;

Grade 2: more than 5% of coatings at a cut edge or a cut intersection fall off, but no more than 15% of the grid region is affected;

Grade 3: coatings at a cut edge partly or fully fall off in the form of a debris, and 15% to 35% of the grid region is affected.

TABLE 1

| Composite | Adhesion (Grade) |
|---|---|
| A1 | 1 |
| A2 | 1 |
| A3 | 0 |
| A4 | 0 |
| A5 | 0 |

It can be concluded from Table 1 that, with the coating composition and the method for forming the composite described herein, the adhesion between the metal layer and the insulating substrate is excellent.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A coating composition comprising:
   a solvent,
   an adhesive, and
   a catalyst precursor comprising each of $SnO_2$, $ZnSnO_3$, and $ZnTiO_3$.

2. The coating composition according to claim 1, further comprising one or more additives each independently selected from a dispersing agent, an antifoaming agent, a leveling agent, and a viscosity regulator.

3. The coating composition of claim 1:
   wherein the catalyst precursor is configured to transform into a chemical plating catalyst upon irradiation by a laser.

4. The coating composition according to claim 3, wherein based on 100 weight parts of the solvent, the amount of the chemical plating catalyst precursor ranging from about 100 weight parts to about 300 weight parts, and the amount of the adhesive ranges from about 5 weight parts to about 15 weight parts.

5. The coating composition according to claim 3, further comprising an additive.

6. The coating composition according to claim 5, wherein based on 100 weight parts of the solvent, the amount of the additive ranges from about 0.1 weight parts to about 15 weight parts.

7. The coating composition according to claim 3, wherein the chemical plating catalyst precursor has an average particle diameter ranging from about 1 nanometer to about 1 micron.

8. The coating composition according to claim 3, wherein the adhesive comprises at least one selected from the group consisting of air-curing acrylic resins, UV-curing acrylic resins, heat-curing polyurethane, and water-curing polyurethane.

9. The coating composition according to claim 3, wherein the solvent comprises at least one selected from the group consisting of water, benzenes, trichloroethylene, alcohols having a general formula of $C_nH_{2n+2}O$, ketones solvent having a general formula of $C_mH_{2m}O$, diketones having a general formula of $C_aH_{2a-2}O_2$, and cyclic ketones having a general formula of $C_bH_{2b-2}O$, wherein n, m, and a are integers and n≥1, m≥3, a≥4, and b=5, 6, 7 or 8.

10. The coating composition according to claim 5, wherein the additive comprises at least one selected from the group consisting of dispersing agent, antifoaming agent, leveling agent, and viscosity regulator.

11. The coating composition of claim 3, wherein the catalyst precursor is configured to transform into a chemical plating catalyst comprising one or more crystal defects upon irradiation by a laser.

12. The coating composition according to claim 11, wherein the crystal defects are in the form of oxygen vacancies.

13. A coating composition, comprising:
    a solvent,
    an adhesive,
    a catalyst precursor comprising $SnO_2$, $SnZO_3$, or $ZnTiO_3$, or combinations thereof, and
    two or more additives, two of which are of a different type, wherein the type of an additive is selected from a dispersing agent, an antifoaming agent, a leveling agent, and a viscosity regulator, wherein the two or more additives comprises a dispersing agent, an antifoaming agent, a leveling agent, and a viscosity regulator, and wherein based on 100 weight parts of the solvent, the amount of the dispersing agent ranges from about 0.5 weight parts to about 4 weight parts, the amount of the antifoaming agent ranges from about 0.3 weight parts to about 3 weight parts, the amount of the leveling agent ranges from about 0.1 weight parts to about 4 weight parts, and the amount of the viscosity agent ranges from about 1 weight parts to about 3 weight parts.

14. The coating composition according to claim 13, wherein the catalyst precursor is configured to transform into a chemical plating catalyst upon irradiation by a laser.

* * * * *